US008772826B2

(12) United States Patent
Asao et al.

(10) Patent No.: US 8,772,826 B2
(45) Date of Patent: Jul. 8, 2014

(54) PHOTOELECTRIC CONVERSION DEVICE

(75) Inventors: Hideaki Asao, Higashiomi (JP); Rui Kamada, Higashiomi (JP); Shuichi Kasai, Kagoshima (JP); Seiji Oguri, Higashiomi (JP); Isamu Tanaka, Higashiomi (JP); Nobuyuki Horiuchi, Higashiomi (JP); Kazumasa Umesato, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/701,150

(22) PCT Filed: May 30, 2011

(86) PCT No.: PCT/JP2011/062327
§ 371 (c)(1),
(2), (4) Date: Nov. 30, 2012

(87) PCT Pub. No.: WO2011/152334
PCT Pub. Date: Dec. 8, 2011

(65) Prior Publication Data
US 2013/0069187 A1 Mar. 21, 2013

(30) Foreign Application Priority Data

May 31, 2010 (JP) ................................ 2010-124745
Jun. 24, 2010 (JP) ................................ 2010-144051

(51) Int. Cl.
*H01L 29/88* (2006.01)
*H01L 29/861* (2006.01)

(52) U.S. Cl.
USPC ........... 257/104; 257/189; 257/200; 257/201; 257/249; 257/613; 257/E21.006; 257/E21.007; 257/E21.053; 257/E21.077; 257/E21.127; 257/E21.311; 257/E21.319; 257/E21.352

(58) Field of Classification Search
USPC ......... 257/104, 189, 200, 201, 15, 40, 79, 83, 257/88, 184, 213, 290, 292, 613, 249
See application file for complete search history.

(56) References Cited

U.S. PATENT DOCUMENTS

| 6,566,162 | B2 | 5/2003 | Yamada et al. | |
| 8,012,546 | B2 * | 9/2011 | Ishizuka et al. | 427/569 |
| 8,252,611 | B2 * | 8/2012 | Kawano | 438/22 |
| 8,278,134 | B2 * | 10/2012 | Tanaka et al. | 438/95 |
| 8,415,557 | B2 * | 4/2013 | Fukunaga et al. | 136/260 |
| 2002/0160539 | A1 | 10/2002 | Yamada et al. | |

FOREIGN PATENT DOCUMENTS

| JP | H04-056172 A | 2/1992 |
| JP | H05-055615 A | 3/1993 |
| JP | H06-120545 A | 4/1994 |
| JP | 2000-156517 A | 6/2000 |
| JP | 2000-174306 A | 6/2000 |
| JP | 2001-223374 A | 8/2001 |
| JP | 2002-329877 A | 11/2002 |

OTHER PUBLICATIONS

International Preliminary Report on Patentability issued for International Application No. PCT/JP2011/062327.

* cited by examiner

*Primary Examiner* — David Nhu
(74) *Attorney, Agent, or Firm* — Procopio, Cory, Hargreaves & Savitch LLP

(57) ABSTRACT

It is an object to provide a photoelectric conversion device with high photoelectric conversion efficiency. The photoelectric conversion device includes an electrode layer, and a light absorbing layer located on the electrode layer. The light absorbing layer is comprised of a plurality of stacked semiconductor layers containing a chalcopyrite-based compound semiconductor. The semiconductor layers contain oxygen. A molar concentration of the oxygen in surfaces and their vicinities of the semiconductor layers where the semiconductor layers are stacked on each other is higher than average molar concentrations of the oxygen in the semiconductor layers.

6 Claims, 2 Drawing Sheets

PHOTOELECTRIC CONVERSION DEVICE

CROSS REFERENCE TO RELATED APPLICATIONS

The application is a 371 of PCT/JP2011/062327 filed May 30, 2011; JAPAN 2010-144051 filed Jun. 24, 2010; JAPAN 2010-124745 filed May 31, 2010.

TECHNICAL FIELD

The present invention relates to a photoelectric conversion device.

BACKGROUND ART

Some photoelectric conversion devices include a light absorbing layer comprised of a chalcopyrite-based Group I-III-VI compound semiconductor such as CIGS. Japanese Patent Application Laid-Open No. 2000-156517 describes an example where a light absorbing layer comprised of a thin film of a compound semiconductor such as $Cu(In,Ga)Se_2$ is located on an electrode formed on a substrate. Located on this light absorbing layer are a buffer layer comprised of CdS and a transparent conductive film comprised of ITO.

In this photoelectric conversion device, a vacancy generated in part of a chalcopyrite structure may lead to a defect. If such a defect is generated in the light absorbing layer, it becomes hard to extract a large current from the light absorbing layer.

DISCLOSURE OF THE INVENTION

It is an object of the present invention to enhance photoelectric conversion efficiency by reducing a vacancy that leads to a defect of a chalcopyrite structure of a light absorbing layer.

A photoelectric conversion device according to an embodiment of the present invention includes an electrode layer, and a light absorbing layer located on the electrode layer. In the present embodiment, the light absorbing layer is comprised of a plurality of stacked semiconductor layers containing a chalcopyrite-based Group I-III-VI compound semiconductor. The semiconductor layers contain oxygen. A molar concentration of the oxygen in surfaces and their vicinities of the semiconductor layers where the semiconductor layers are stacked on each other is higher than average molar concentrations of the oxygen in the semiconductor layers.

In the photoelectric conversion device according to the embodiment of the present invention, a defect which is likely to be generated at an interface between adjacent semiconductor layers and in their vicinities can be filled with oxygen easily. As a result, photoelectric conversion efficiency is enhanced.

EMBODIMENT(S) FOR CARRYING OUT THE INVENTION

Figure 1:
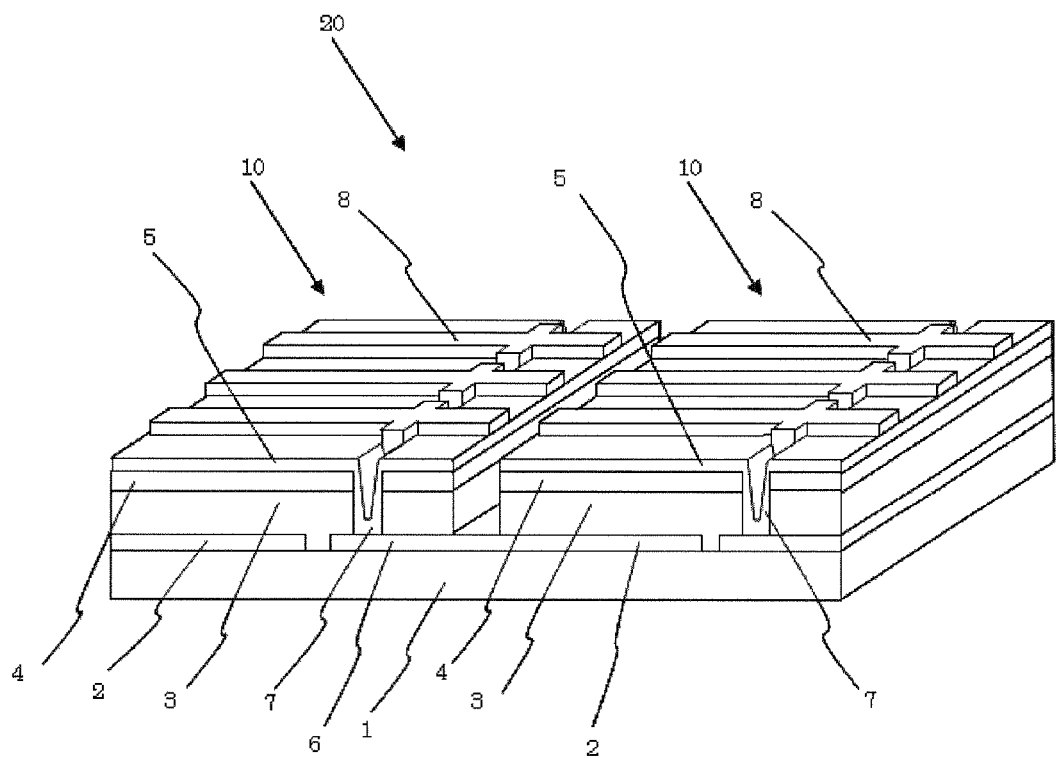
FIG. 1 is a perspective view showing an example of an embodiment of a photoelectric conversion device of the present invention.

As shown in FIG. 1, photoelectric conversion devices 10 each include a substrate 1, a first electrode layer 2, a light absorbing layer 3, a buffer layer 4, and a second electrode layer 5. The photoelectric conversion devices 10 include a third electrode layer 6 spaced apart from the first electrode layer 2 and located on a side of the light absorbing layer 3 close to the substrates 1. The photoelectric conversion devices 10 adjacent to each other are electrically connected through a connecting conductor 7. To be specific, the second electrode layer 5 of one of the photoelectric conversion devices 10 is connected through the connecting conductor 7 to the third electrode layer 6 of the other photoelectric conversion device 10. The third electrode layer 6 also functions as the first electrode layer 2 of the adjacent photoelectric conversion device 10, thereby forming series connection between the adjacent photoelectric conversion devices 10. In one photoelectric conversion device 10, the connecting conductor 7 is provided to divide each of the light absorbing layer 3 and the buffer layer 4. So, in the photoelectric conversion device 10, the light absorbing layer 3 and the buffer layer 4 placed between the first and second electrode layers 2 and 5 realize photoelectric conversion. Additionally, power collecting electrodes 8 may be located on the second electrode layer 5 as in the present embodiment.

The substrate 1 is provided to support the photoelectric conversion device 10. Examples of a material for the substrate 1 include glass, ceramic, and resin.

The first and third electrode layers 2 and 6 are comprised of molybdenum (Mo), aluminum (Al), titanium (Ti), or gold (Au), for example. The first and third electrode layers 2 and 6 are formed on the substrate 1 by sputtering method or vapor deposition method, for example.

The light absorbing layer 3 is provided to absorb light, and further, work cooperatively with the buffer layer 4 to realize photoelectric conversion. The light absorbing layer 3 contains a chalcopyrite-based compound semiconductor, and is located on the first and third electrode layers 2 and 6. The chalcopyrite-based compound semiconductor mentioned here (also called a CIS-based compound semiconductor) is a compound semiconductor of a Group I-B element (also called a Group 11 element), a group III-B element (also called a Group 13 element), and a group VI-B element (also called a Group 16 element). This compound semiconductor is also called a chalcopyrite-based Group I-III-VI compound semiconductor. Examples of the chalcopyrite-based compound semiconductor include $Cu(In,Ga)Se_2$ (also called CIGS), $Cu(In,Ga)(Se,S)_2$ (also called CIGSS), and $CuInS_2$ (also called CIS). $Cu(In,Ga)Se_2$ is a compound mainly containing Cu, In, Ga, and Se. Further, $Cu(In,Ga)(Se,S)_2$ is a compound mainly containing Cu, In, Ga, Se, and S.

Figure 2:
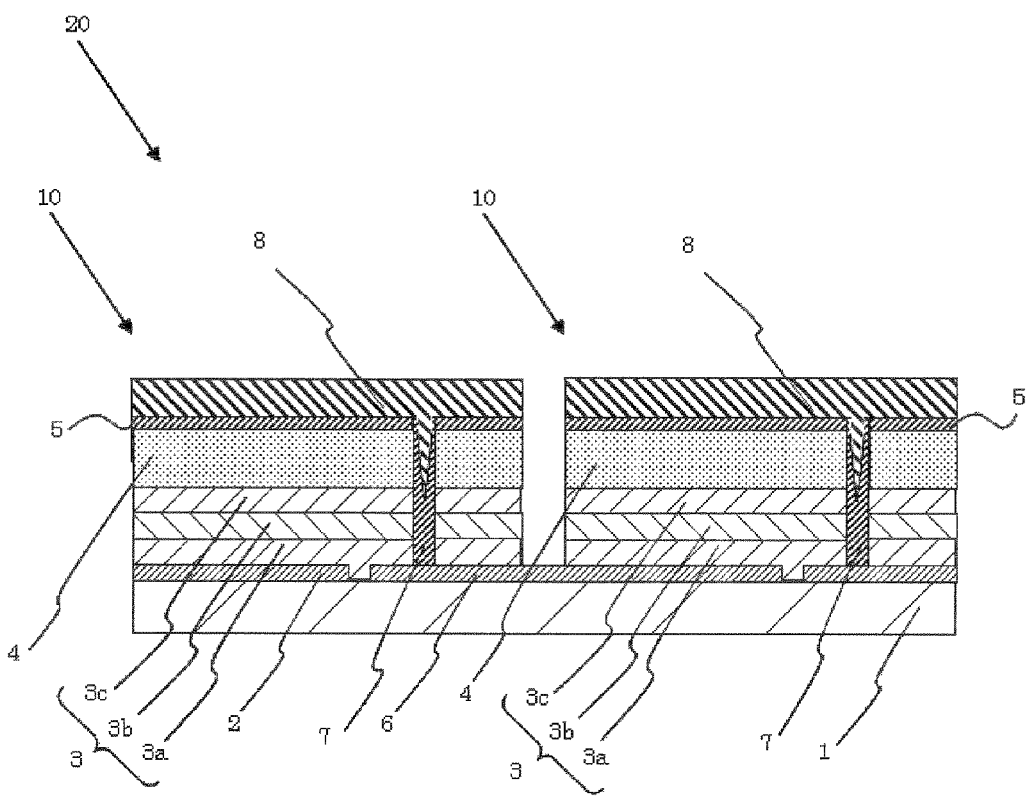
FIG. 2 is a sectional view showing an example of the embodiment of the photoelectric conversion device of the present invention.
Figure 3:
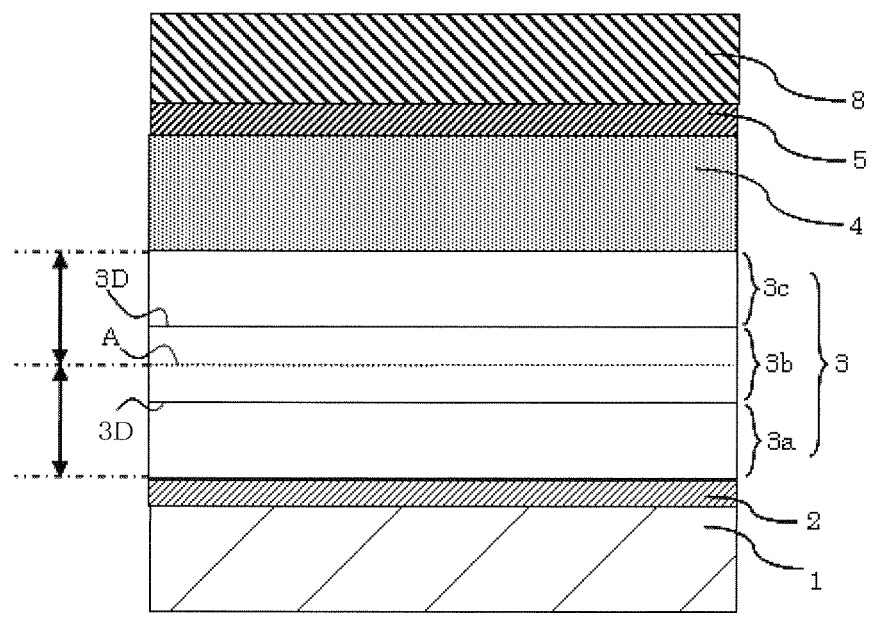
FIG. 3 is a schematic view showing a cross section of FIG. 2 partially.

In the present embodiment, the light absorbing layer 3 is formed by stacking a plurality of semiconductor layers containing the chalcopyrite-based compound semiconductor. More specifically, as shown in FIG. 2, the light absorbing layer 3 includes a first layer 3a close to the first electrode layer 2, a second layer 3b located on the first layer 3a, and a third layer 3c located on the second layer 3b. The light absorbing layer 3 includes the stacked semiconductor layers. So, even if a crack generated in a surface or near the surface of the light absorbing layer 3 on a side opposite the first electrode layer 2 develops in a direction in which the semiconductor layers are stacked, the development can be stopped easily at boundaries 3D between the layers shown in FIG. 3. This reduces the quantity of cracks to reach the first electrode layer 2. So, generation of a leak due to a crack can be reduced in the present embodiment. As a result, photoelectric conversion efficiency is enhanced. The boundaries 3D correspond to a contact surface between the first and second layers 3a and 3b, and a contact surface between the second and third layers 3b and 3c as shown in FIG. 3. Each semiconductor layer contains a plurality of crystals. Grain boundary surfaces exist between the crystals. At the boundaries 3D, these grain boundary surfaces are positioned in substantially the same plane in a direction perpendicular to the direction in which the semiconductor layers (first to third layers) are stacked. If the grain boundary surfaces are at an angle of 10 degrees or less relative to the direction perpendicular to the direction in which the semiconductor layers are stacked and these grain boundary surfaces are arranged in substantially the same plane in some region, this region can be considered as the boundary 3D. The direction of the grain boundary surfaces can be recognized with a transmission analytical electron microscope (TEM), for example. Additionally, if voids are provided in a direction in which the grain boundary surfaces are aligned, development of a crack can be stopped more easily by the presence of the voids.

The light absorbing layer 3 may have a thickness of from 1 to 2.5 μm, for example. This enhances photoelectric conversion efficiency. In this case, the first layer 3a of the light absorbing layer 3 may have a thickness of from 0.2 to 1 μm, for example. Further, the second and third layers 3b and 3c may each have a thickness of from 0.5 to 1.5 μm.

The semiconductor layers of the light absorbing layer 3 contain oxygen. In this case, the molar concentration of oxygen in surfaces and their vicinities of semiconductor layers where the semiconductor layers are stacked on each other is higher than the average molar concentrations of oxygen in these semiconductor layers. More specifically, in the present embodiment, a molar concentration of oxygen in the boundary 3D between the first and second layers 3a and 3b and in the vicinity of this boundary 3D is higher than the average molar concentrations of oxygen in the corresponding semiconductor layers (first and second layers 3a and 3b). Further, the molar concentration of oxygen in the boundary 3D between the second and third layers 3b and 3c and in the vicinity of this boundary 3D is higher than the average molar concentrations of oxygen in the corresponding semiconductor layers (second and third layers 3b and 3c). In this mode, a defect due to generation of a vacancy in part of a chalcopyrite structure, which is likely to be generated at an interface (boundary 3D) between adjacent semiconductor layers and in the vicinity of the interface, can be filled with oxygen easily. As a result, photoelectric conversion efficiency is enhanced.

The aforementioned surfaces and their vicinities of adjacent semiconductor layers where the semiconductor layers are stacked on each other correspond to parts that cover areas of from about 50 to about 100 nm from the boundary 3D in a direction of the thickness of each semiconductor layer, for example. In this case, it is sufficient that the molar concentration of oxygen in the aforementioned surfaces and their vicinities is higher by from 5 to 20 mole percent than the average molar concentrations of oxygen in semiconductor layers including these surfaces and their vicinities. This can reduce excessive quantities of oxygen in the semiconductor layers while allowing of a defect to be filled with oxygen.

The molar concentration of oxygen in the light absorbing layer 3 may be measured by energy dispersive x-ray spectroscopy (EDS) while cross sections are observed with an electron microscope, for example. Alternatively, the other measuring methods include a measuring method, in which x-ray photoelectron spectroscopy (XPS), Auger electron spectroscopy (AES), secondary ion mass spectroscopy (SIMS) or the like is used while the light absorbing layer 3 is cut by sputtering in a direction of the depth thereof.

The molar concentration of oxygen in the aforementioned surfaces and their vicinities in the light absorbing layer 3 can be calculated by measuring the molar concentration of oxygen at arbitrarily determined 10 positions by employing the aforementioned measuring method, and obtaining an average of the measured concentrations. Further, the average molar concentrations of oxygen in the semiconductor layers can be calculated by measuring the molar concentration of oxygen at arbitrarily determined 10 positions in a portion except the aforementioned surfaces and their vicinities, and obtaining averages of the measured concentrations. As an example, energy dispersive x-ray spectroscopy was employed to measure the molar concentration of oxygen in the light absorbing layer 3 of the photoelectric conversion device 10 shown in FIG. 2. The resultant molar concentration of oxygen was 8 mole percent in each of the first, second and third layers 3a, 3b and 3c. Meanwhile, the resultant molar concentration of oxygen in the boundary 3D between the first and second layers 3a and 3b and in the vicinity of this boundary 3D was 10 mole percent. Further, the resultant molar concentration of oxygen in the boundary 3D between the second and third layers 3b and 3c and in the vicinity of this boundary 3D was 10 mole percent. The photoelectric conversion device 10 in this condition achieves higher photoelectric conversion efficiency than that achieved by a photoelectric conversion device where the light absorbing layer 3 has a substantially uniform oxygen concentration.

The light absorbing layer 3 can be formed by the following method (method A), for example. First, a Group I-B element and a Group III-B element are supplied by sputtering method on the substrate 1 on which the first electrode layer 2 is formed to form a precursor layer (step A1). In the step A1, after the precursor layer is formed to a thickness of about 90 percent of a desirable thickness, oxygen is supplied further to provide the remaining thickness of the precursor layer. If the precursor layer is formed in a chamber, for example, oxygen is supplied into the chamber at desirable time, so that the remaining 10 percent of the precursor layer can be formed in an oxygen atmosphere. Next, the precursor layer is heated in an atmosphere containing a VI-B element at temperatures of from 500 to 600° C., thereby forming the first layer 3a of the light absorbing layer 3 (step A2). The steps A1 and A2 are repeated to form the light absorbing layer 3 with a plurality of semiconductor layers including the first, second and third layers 3a, 3b and 3c. In the method A, oxygen can be supplied easily on a surface of the precursor layer, so that the molar concentration of oxygen can be increased in surfaces and their vicinities of the semiconductor layers of the light absorbing layer 3. In the method A, the light absorbing layer 3 may also be formed by repeating the step A1 a desirable number of times to form a plurality of precursor layers, and thereafter, by performing the heat treatment in the step A2 to fire the precursor layers simultaneously. This simplifies the manufacturing steps.

The light absorbing layer 3 can also be formed by the following method (method B), for example. First, a material solution containing a Group I-B element, a group III-B element, and a Group VI-B element is applied on the substrate 1 on which the first electrode layer 2 is formed, thereby forming a first precursor (step B1). Here, the material solution is applied by using spin coating, screen printing, dipping, spraying, or die coating, for example. Next, the first precursor is subjected to calcination (heat treatment) in an atmosphere containing oxygen of from 10 to 50 ppm to form a first calcined precursor (step B2). The first calcined precursor is formed in the step B2 at temperatures of from 150 to 400° C. Then, the first calcined precursor is heated to form the first layer 3a of the light absorbing layer 3 (step B3). The first layer 3a is formed in the step B3 at temperatures of from 450 to 600° C.

Next, a material solution containing the Group I-B element, the group III-B element, and the Group VI-B element is applied on the first layer 3a, thereby forming a second precursor (step B4). Then, the second precursor is subjected to calcination (heat treatment) in an atmosphere containing oxygen of from 10 to 50 ppm to form a second calcined precursor (step B5). The second calcined precursor is formed in the step B5 at temperatures of from 150 to 400° C. Next, the second calcined precursor is heated to form the second layer 3b (step B6). The second layer 3b is formed in the step B6 at temperatures of from 450 to 600° C.

Next, a material solution containing the Group I-B element, the group III-B element, and the Group VI-B element is applied on the second layer 3b, thereby forming a third precursor (step B7). Then, the third precursor is subjected to calcination (heat treatment) in an atmosphere containing oxygen of from 10 to 50 ppm to form a third calcined precursor (step B8). The third calcined precursor is formed in the step B8 at temperatures of from 150 to 400° C. Next, the third calcined precursor is heated in an atmosphere containing oxygen of from 10 to 50 ppm to form the third layer 3c (step B9). The third layer 3c is formed in the step B9 at temperatures of from 450 to 600° C.

As described above, in the method B, the precursors are heated in an oxygen atmosphere to form the calcined precursors. This makes it possible to increase the molar concentration of oxygen in surfaces and their vicinities of the calcined precursors. So, the molar concentration of oxygen in surfaces and their vicinities of the first and second layers 3a and 3b where the first and second layers 3a and 3b are stacked on each other becomes higher than the respective average concentrations of oxygen in the first and second layers 3a and 3b. Further, the molar concentration of oxygen in surfaces and their vicinities of the second and third layers 3b and 3c where the second and third layers 3b and 3c are stacked on each other becomes higher than the respective average concentrations of oxygen in the second and third layers 3b and 3c.

In order to form the light absorbing layer 3 with three or more semiconductor layers, the aforementioned steps B1 to B3 may be repeated a desirable number of times, for example. In the method B, the light absorbing layer 3 may also be formed without the steps B3 and B6, for example. In this case, the light absorbing layer 3 may be formed by stacking the first, second, and third calcined precursors, and thereafter, by performing heat treatment such as that of the step B9 to fire the calcined precursors simultaneously. To be specific, in this method, after all the calcined precursors to become the semiconductor layers of the light absorbing layer 3 are stacked, heat treatment is performed to form the semiconductor layers. This simplifies the manufacturing steps.

In order to raise a temperature at a rate of 20° C./min or higher temporarily in the aforementioned step B2, B5 or B8 of the method B, calcination may be performed according to a two-stage temperature profile. Such a temperature profile may be achieved by performing heating at temperatures of from 150 to 300° C. for a duration of from about two to about 10 minutes, and thereafter, by performing heating at temperatures of from 200 to 400° C. for a duration of from about 10 to about 90 seconds, for example. If the group VI-B element is supplied in the aforementioned step B9 of the method B, the light absorbing layer 3 can be supplemented with the group VI-B element.

The temperature at which each layer of the light absorbing layer 3 is formed in the aforementioned methods A and B is the temperature of an atmosphere in each step. Meanwhile, in each of the methods, the temperatures at which the first to third layers 3a to 3c are formed may be the temperature of the substrate 1 itself. Controlling the temperature of the substrate 1 is easier than controlling the temperature of an atmosphere, thereby simplifying the manufacturing steps.

A material solution used in the aforementioned application method may contain a Group I-B metal, a Group III-B metal, a chalcogen element-containing organic compound, and a Lewis base organic solvent. The Group I-B metal and the Group III-B metal can dissolve well in a solvent containing the chalcogen element-containing organic compound and the Lewis base organic solvent (hereinafter also called a mixed solvent S). This mixed solvent S allows formation of a material solution where a total concentration of the Group I-B metal and the Group III-B metal is 6% by mass or more of the mixed solvent S. Use of this mixed solvent S is capable of increasing a degree of solubility of the aforementioned metals, making it possible to obtain a high-concentration material solution. The material solution is described in detail below.

The chalcogen element-containing organic compound is an organic compound containing a chalcogen element. The chalcogen element corresponds to S, Se or Te belonging to the Group VI-B. If the chalcogen element is S, examples of the chalcogen element-containing organic compound include thiol, sulfide, disulfide, thiophene, sulfoxide, sulfone, thioketone, sulfonic acid, sulfonic acid ether, and sulfonic acid amide. Of the compounds listed here, compounds such as thiol, sulfide, and disulfide form a complex easily together with metal. If the chalcogen element-containing organic compound includes a phenyl group, the application properties of the chalcogen element-containing organic compound are enhanced. Examples of such a compound include thiophenol and diphenyl sulfide, and derivatives thereof.

If the chalcogen element is Se, examples of the chalcogen element-containing organic compound include selenol, selenide, diselenide, selenoxide, and selenone. Of the compounds listed here, compounds such as selenol, selenide, and diselenide form a complex easily together with metal. If the chalcogen element-containing organic compound is phenylselenol, phenyl selenide and diphenyl selenide each including a phenyl group, and derivatives thereof, the application properties of the chalcogen element-containing organic compound are enhanced.

If the chalcogen element is Te, examples of the chalcogen element-containing organic compound include tellurol, telluride, and ditelluride.

The Lewis base organic solvent is an organic solvent capable of forming a Lewis base. Examples of the Lewis base organic solvent include pyridine, aniline, triphenylphosphine, and derivatives thereof. If the Lewis base organic solvent has a boiling point of 100° C. or higher, the application properties of the Lewis base organic solvent are enhanced.

The Group I-B metal and the chalcogen element-containing organic compound may be chemically bonded. The Group III-B metal and the chalcogen element-containing organic compound may be chemically bonded. The chalcogen element-containing organic compound and the Lewis base organic solvent may be chemically bonded. If metal, the chalcogen element-containing organic compound, the Lewis base organic solvent, and the like are chemically bonded, the metal occupies 8% by mass or more of the material solution to provide a higher-concentration material solution as described above. The aforementioned chemical bonds may be achieved by coordinate bonds between the elements, for example. These chemical bonds can be confirmed for example by NMR (nuclear magnetic resonance) method. The NMR method may detect a chemical bond between the Group I-B metal and the chalcogen element-containing organic compound as a peak shift of multinuclear NMR of the chalcogen element. The NMR method may detect a chemical bond between the Group III-B metal and the chalcogen element-containing organic compound as a peak shift of multinuclear NMR of the chalcogen element. Further, the NMR method may detect a chemical bond between the chalcogen element-containing organic compound and the Lewis base organic solvent as a shift of a peak derived from the organic solvent. The number of moles of the chemical bond between the Group I-B metal and the chalcogen element-containing organic compound may be in a range of from 0.1 to 10 times the number of moles of the chemical bond between the chalcogen element-containing organic compound and the Lewis base organic solvent.

The mixed solvent S may be prepared by mixing the chalcogen element-containing organic compound and the Lewis base organic solvent so that the mixed solvent S is in a liquid form at room temperatures. This facilitates handling of the mixed solvent S. As a ratio to achieve this condition, the chalcogen element-containing organic compound in an amount of from 0.1 to 10 times the amount of the Lewis base organic solvent may be mixed with the Lewis base organic solvent. This forms the aforementioned chemical bonds favorably to obtain a high-concentration solution of the Group I-B metal and the Group III-B metal.

The material solution may be formed by making the Group I-B metal and the Group III-B metal dissolve directly in the mixed solvent S, for example. This way allows reduction of mixture of impurities except components of the compound semiconductor into the light absorbing layer 3. Either the Group I-B metal or the Group III-B metal may be metal salt. Making the Group I-B metal and the Group III-B metal dissolve directly in the mixed solvent S means mixing a raw metal of a single metal or a raw metal of an alloy directly with the mixed solvent S, and making the raw metal dissolve in the mixed solvent S. So, the raw metal of a single metal or that of an alloy is not required to be changed once to a different compound (metal salt such as chloride) before it dissolves in the solvent. This process simplifies steps, and allows reduction of mixture of impurities except the elements to form the light absorbing layer 3 into the light absorbing layer 3. So, the light absorbing layer 3 is given enhanced purity.

The Group I-B metal is Cu or Ag, for example. The Group I-B metal may include one element, or elements of two or more types. If Group I-B metal elements of two or more types are used, a mixture of the Group I-B metals of two or more types may be made to dissolve at one time in the mixed solvent S. Or, the Group I-B metals of corresponding elements may be made to dissolve in the mixed solvent S separately, and then mixed.

The Group III-B metal is Ga or In, for example. The Group III-B metal may include one element, or elements of two or more types. If Group III-B metal elements of two or more types are used, a mixture of the Group III-B metals of two or more types may be made to dissolve at one time in the mixed solvent S. Or, the Group III-B metals of corresponding elements may be made to dissolve in the mixed solvent S separately, and then mixed.

The semiconductor layers of the light absorbing layer 3 may contain selenium. In this case, the molar concentration of selenium in surfaces and their vicinities of semiconductor layers where the semiconductor layers are stacked on each other may be lower than the average molar concentrations of selenium in the semiconductor layers. More specifically, the molar concentration of selenium in the boundary 3D between the first and second layers 3a and 3b and in the vicinity of this boundary 3D is lower than the average molar concentrations of selenium in the corresponding semiconductor layers (first and second layers 3a and 3b). Further, the molar concentration of selenium in the boundary 3D between the second and third layers 3b and 3c and in the vicinity of this boundary 3D is lower than the average molar concentrations of selenium in the corresponding semiconductor layers (second and third layers 3b and 3c). This mode achieves a gradient of a band in a boundary between adjacent semiconductor layers and in the vicinity of the boundary. So, carriers generated as a result of irradiation of the semiconductor layers with light are transferred efficiently to a pn junction and its vicinity. Thus, in the present embodiment, carriers can be collected more efficiently to enhance photoelectric conversion efficiency. The aforementioned surfaces and their vicinities of adjacent semiconductor layers where the semiconductor layers are stacked on each other correspond to parts that cover areas of from about 50 to about 100 nm from the boundary 3D in a direction of the thickness of each semiconductor layer, for example. More specifically, it is preferable that the molar concentration of selenium in surfaces and their vicinities of semiconductor layers where the semiconductor layers are stacked on each other be lower by from about 5 to about 20 mole percent than the average molar concentrations of selenium in these semiconductor layers.

The light absorbing layer 3 in this condition may be formed by raising temperature during calcination at a rate higher than a usual rate in the calcination step of a precursor such as the aforementioned step B2, B5 or B8 of the method B. This causes desorption of selenium from a surface and its vicinity of the precursor to lower the molar concentration of selenium in this surface and its vicinity. More specifically, the aforementioned rate of temperature raise may be increased to from 10 to 20° C./min, for example.

The semiconductor layers of the light absorbing layer 3 may contain gallium (Ga). In this case, the molar concentration of gallium in surfaces and their vicinities of semiconductor layers where the semiconductor layers are stacked on each other may be higher than the average molar concentrations of gallium in the semiconductor layers. More specifically, in the present embodiment, the molar concentration of gallium in the boundary 3D between the first and second layers 3a and 3b and in the vicinity of this boundary 3D is higher than the average molar concentrations of gallium in the corresponding semiconductor layers (first and second layers 3a and 3b). Further the molar concentration of gallium in the boundary 3D between the second and third layers 3b and 3c and in the vicinity of this boundary 3D is higher than the average molar concentrations of gallium in the corresponding semiconductor layers (second and third layers 3b and 3c). This mode achieves a gradient of a band in a boundary between adjacent semiconductor layers and in the vicinity of the boundary. So, carriers generated as a result of irradiation of the semiconductor layers with light are transferred efficiently to a pn junction and its vicinity. Thus, in the present embodiment, carriers can be collected more efficiently to enhance photoelectric conversion efficiency. The aforementioned surfaces and their vicinities of adjacent semiconductor layers where the semiconductor layers are stacked on each other correspond to parts that cover areas of from about 50 to about 100 nm from the boundary 3D in a direction of the thickness of each semiconductor layer, for example. More specifically, it is preferable that the molar concentration of gallium in surfaces and their vicinities of semiconductor layers where the semiconductor layers are stacked on each other be higher by from about 1 to about 10 mole percent than the average molar concentrations of gallium in these semiconductor layers.

The light absorbing layer 3 in this condition may be formed by performing calcination in an air atmosphere in the calcination step of a precursor such as the aforementioned step B2, B5 or B8 of the method B. As a result of this process, gallium is easily deposited at lower part of each semiconductor layer in the form of gallium oxide that is hard to form gallium selenide. This makes it possible to provide a part of the high concentration of gallium in the boundary 3D between semiconductor layers and in the vicinity of this boundary 3D.

The aforementioned molar concentrations of selenium and gallium in the light absorbing layer 3 can be measured by using the same method as that of measuring the molar concentration of oxygen. Further, the average molar concentrations of selenium and gallium can be calculated by measuring the molar concentrations of selenium and gallium at arbitrarily determined 10 positions in a corresponding region, and obtaining averages of the measured concentrations. As an example, energy dispersive x-ray spectroscopy was employed to measure the average molar concentration of selenium in the light absorbing layer 3 of the photoelectric conversion device 10 shown in FIG. 2. The resultant average molar concentration of selenium was 49 mole percent in each of the first, second and third layers 3a, 3b and 3c. Meanwhile, the resultant molar concentration of selenium in the boundary 3D between the first and second layers 3a and 3b and in the vicinity of this boundary 3D was 44 mole percent. Further, the resultant molar concentration of selenium in the boundary 3D between the second and third layers 3b and 3c and in the vicinity of this boundary 3D was 44 mole percent. The photoelectric conversion device 10 in this condition achieves higher photoelectric conversion efficiency than that achieved by a photoelectric conversion device where the light absorbing layer 3 has a substantially uniform selenium concentration. Likewise, energy dispersive x-ray spectroscopy was employed to measure the average molar concentration of gallium in the light absorbing layer 3. The resultant average molar concentration of gallium was 8 mole percent in each of the first, second and third layers 3a, 3b and 3c. Meanwhile, the resultant molar concentration of gallium in the boundary 3D between the first and second layers 3a and 3b and in the vicinity of this boundary 3D was 10 mole percent. Further, the resultant molar concentration of gallium in the boundary 3D between the second and third layers 3b and 3c and in the vicinity of this boundary 3D was 10 mole percent. The photoelectric conversion device 10 in this condition achieves higher photoelectric conversion efficiency than that achieved by a photoelectric conversion device where the light absorbing layer 3 has a substantially uniform gallium concentration.

The buffer layer 4 is formed on the light absorbing layer 3. The buffer layer 4 is a semiconductor layer to form a heterojunction (pn junction) together with the light absorbing layer 3. So, a pn junction is formed at an interface between the light absorbing layer 3 and the buffer layer 4 or in the vicinity of the interface. If the light absorbing layer 3 is a p-type semiconductor, the buffer layer 4 is an n-type semiconductor. The buffer layer 4 is capable of reducing a leakage current further if it has a resistivity of 1 Ω·cm or higher. The buffer layer 4 may be comprised of CdS, ZnS, ZnO, $In_2S_3$, In(OH,S), (Zn,In)(Se,OH) or (Zn,Mg)O, for example. The buffer layer 4 may be formed by chemical bath deposition (CBD) method, for example. In(OH,S) is a compound mainly containing In, OH, and S. (Zn,In)(Se,OH) is a compound mainly containing Zn, In, Se, and OH. (Zn,Mg)O is a compound mainly containing Zn, Mg, and O. The buffer layer 4 is capable of enhancing the absorption efficiency of the light absorbing layer 3 if it has properties of transmitting light in a wavelength region to be absorbed by the light absorbing layer 3.

If the buffer layer 4 contains indium (In), the second electrode layer 5 may contain indium oxide. This allows reduction of change of an electrical conductivity to be caused by interdiffusion of elements between the buffer layer 4 and the second electrode layer 5. Furthermore, the light absorbing layer 3 may be comprised of a chalcopyrite-based material containing indium. In this mode, the light absorbing layer 3, the buffer layer 4, and the second electrode layer 5 contain indium, so that change of an electrical conductivity and change of a carrier concentration to be caused by interdiffusion of elements between the layers can be reduced.

The buffer layer 4 is capable of enhancing the resistance to moisture of the photoelectric conversion device 10 if it mainly contains a Group III-VI compound. The Group III-VI compound is a compound of a Group III-B element and a Group VI-B element. Mainly containing the Group III-VI compound means that the concentration of the Group III-VI compound in the buffer layer 4 is 50 mole percent or more. The concentration of the Group III-VI compound in the buffer layer 4 may also be 80 mole percent or more. Additionally, a concentration of Zn in the buffer layer 4 may be 50 atomic percent or less. This enhances the resistance to moisture of the photoelectric conversion device 10. Furthermore, the concentration of Zn in the buffer layer 4 may be 20 atomic percent or less.

The buffer layer 4 may have a thickness of from 10 to 200 nm, or from 100 to 200 nm, for example. This makes it possible to reduce decrease of photoelectric conversion efficiency under high temperature and high humidity conditions.

It is preferable that in the light absorbing layer 3, the average molar concentration of oxygen be higher in a semiconductor layer close to the first electrode layer 2 with respect to a central part of a direction in which the semiconductor layers are stacked than in a semiconductor layer close to the buffer layer 4 with respect to the central part. To be specific, in the light absorbing layer 3, the average molar concentration of oxygen is higher in a semiconductor layer close to the first electrode layer 2 with respect to the central part of the stacking direction than in a semiconductor layer on a side opposite the first electrode layer 2 with respect to the central part. As a result, a defect in a semiconductor layer close to the first electrode layer 2 is filled with oxygen. So, the present embodiment is capable of increasing a distance of diffusion of minority carriers in a semiconductor layer close to the first electrode layer 2. This allows the minority carriers to be collected easily in the buffer layer 4, thereby enhancing photoelectric conversion efficiency. More specifically, it is preferable that the average molar concentration of oxygen be higher in a semiconductor layer close to the first electrode layer 2 with respect to the central part of the direction in which the semiconductor layers are stacked by from about 1 to about 20 mole percent than in a semiconductor layer close to the buffer layer 4 with respect to the central part.

The aforementioned central part of the stacking direction of the semiconductor layers indicates a substantially intermediate position A of the plurality of the stacked semiconductor layers in a direction in which the plurality semiconductor layers are stacked as shown in FIG. 3. To be specific, in the present embodiment, the average molar concentration of oxygen differs between a semiconductor layer existing in a region from the substantially intermediate position A to the first electrode layer 2 and a semiconductor layer existing in a region from the substantially intermediate position A to the buffer layer 4. If a semiconductor layer close to the first electrode layer 2 and/or a semiconductor layer close to the buffer layer 4 is replaced with a plurality of semiconductor layers, the average molar concentration of oxygen is calculated by obtaining an average of values measured at arbitrarily determined 10 positions in these semiconductor layers. As an example, energy dispersive x-ray spectroscopy was employed for measurement of the light absorbing layer 3 of the photoelectric conversion device 10 shown in FIG. 3. The resultant average molar concentration of oxygen was 10 mole percent in a semiconductor layer existing in the region from the substantially intermediate position A to the first electrode layer 2. Meanwhile, the resultant average molar concentration of oxygen was 5 mole percent in a semiconductor layer existing in the region from the substantially intermediate position A to the buffer layer 4. The photoelectric conversion device 10 in this condition is capable of enhancing photoelectric conversion efficiency.

As an exemplary method of manufacturing the light absorbing layer 3 in this condition, in a step such as the aforementioned step B3, B6 or B9 of the method B in which a precursor is heated to form a semiconductor layer, the amount of oxygen to be introduced is reduced in the following order during introduction of oxygen of a predetermined amount: step B3, step B6, and step B9. This makes the amount of oxygen smaller in a semiconductor layer close to the buffer layer 4. Or, after all the semiconductor layers are stacked, reduction process is performed in a hydrogen atmosphere for example to make the amount of oxygen smaller in a semiconductor layer close to the buffer layer 4. As a result, the average molar concentration of oxygen can be relatively higher in a semiconductor layer close to the first electrode layer 2 than in a semiconductor layer close to the buffer layer 4.

It is also preferable that in the light absorbing layer 3, the average molar concentration of gallium be higher in a semiconductor layer close to the first electrode layer 2 than in a semiconductor layer at the central part of the stacking direction. If a semiconductor layer close to the first electrode layer 2 is replaced with a plurality of semiconductor layers, the average molar concentration of gallium is calculated by obtaining an average of values measured at arbitrarily determined 10 positions in these semiconductor layers. This mode increases the molar concentration of gallium in a semiconductor layer close to the first electrode layer 2. So, contact force between the first electrode layer 2 and this semiconductor layer is increased. More specifically, it is preferable that the average molar concentration of gallium be higher in a semiconductor layer close to the first electrode layer 2 with respect to the central part of the direction in which the semiconductor layers are stacked by from about 1 to about 40 mole percent than in a semiconductor layer at the central part. As an example, energy dispersive x-ray spectroscopy was employed for measurement of the light absorbing layer 3 of the photoelectric conversion device 10 shown in FIG. 3. The resultant average molar concentration of gallium was 14 mole percent in a semiconductor layer existing in a region from the substantially intermediate position A to the first electrode layer 2. Meanwhile, the resultant average molar concentration of gallium was 4 mole percent in a semiconductor layer existing at the substantially intermediate position A.

As an exemplary method of manufacturing the light absorbing layer 3 in this condition, in the aforementioned method B, gallium of an amount higher than a usual amount is added to a material solution to become a semiconductor layer close to the first electrode layer 2.

It is further preferable that in the light absorbing layer 3, the average molar concentration of gallium be higher in a semiconductor layer close to the buffer layer 4 than in a semiconductor layer at the central part of the stacking direction. If a semiconductor layer close to the buffer layer 4 is replaced with a plurality of semiconductor layers, the average molar concentration of gallium is calculated by obtaining an average of values of these semiconductor layers. This mode increases the molar concentration of gallium in a semiconductor layer close to the buffer layer 4, so that the bandgap of this semiconductor layer can be increased. This increases an output voltage. More specifically, it is preferable that the average molar concentration of gallium be higher in a semiconductor layer close to the buffer layer 4 with respect to the central part of the direction in which the semiconductor layers are stacked by from about 1 to about 40 mole percent than in a semiconductor layer at the central part. As an example, energy dispersive x-ray spectroscopy was employed for measurement of the light absorbing layer 3 of the photoelectric conversion device 10 shown in FIG. 3. The resultant average molar concentration of gallium was 7 mole percent in a semiconductor layer existing in a region from the substantially intermediate position A to the buffer layer 4. Meanwhile, the resultant average molar concentration of gallium was 4 mole percent in a semiconductor layer existing at the substantially intermediate position A.

As an exemplary method of manufacturing the light absorbing layer 3 in this condition, in the aforementioned method B, gallium of an amount higher than a usual amount is added to a material solution to become a semiconductor layer close to the buffer layer 4. Additionally, the aforementioned mode allows the molar concentration of gallium to be relatively low at the central part of the light absorbing layer 3, making it possible to reduce a bandgap. This allows long-wavelength light to contribute to photoelectric conversion, resulting in increase of a current.

The molar concentrations of oxygen and gallium in the semiconductor layers can be measured not only by the energy dispersive x-ray spectroscopy described above but also by x-ray photoelectron spectroscopy, Auger electron spectroscopy, or secondary ion mass spectroscopy, for example. Further, the average molar concentrations of oxygen and gallium can be obtained by calculating respective averages of values measured at arbitrarily determined 10 positions.

The second electrode layer 5 is a transparent conducting film of from 0.05 to 3.0 μm comprised of ITO (indium tin oxide) or ZnO, for example. The second electrode layer 5 is formed by sputtering method, vapor deposition method or chemical vapor deposition (CVD) method, for example. The second electrode layer 5 has a resistivity lower than that of the buffer layer 4, and is provided to extract electric charges generated in the light absorbing layer 3. The second electrode layer 5 is capable of extracting electric charges well if it has a resistivity of lower than 1 Ω·cm and a sheet resistance of 50Ω per square or lower.

In order to enhance the absorption efficiency of the light absorbing layer 3 further, the second electrode layer 5 may have properties of transmitting light well to be absorbed by the light absorbing layer 3. It is sufficient that the second electrode layer 5 has a thickness of from 0.05 to 0.5 μm. This enhances the properties of the second electrode layer 5 to transmit light and allows the second electrode layer 5 to reduce light reflection. Further, the second electrode layer 5 is capable of enhancing light scattering effect and favorably transmitting a current generated as a result of photoelectric conversion. Additionally, if the second electrode layer 5 and the buffer layer 4 have substantially the same index of refraction, reflection of light at an interface between the second electrode layer 5 and the buffer layer 4 can be reduced.

The second electrode layer 5 may mainly contain a Group III-VI compound. This enhances the resistance to moisture of the photoelectric conversion device 10. Mainly containing the Group III-VI compound means that the concentration of the Group III-VI compound in the second electrode layer 5 is 50 mole percent or more. The concentration of the Group III-VI compound in the second electrode layer 5 may also be 80 mole percent or more. Additionally, the concentration of Zn in the second electrode layer 5 may be 50 atomic percent or less. This enhances the resistance to moisture of the photoelectric conversion device 10. The concentration of Zn in the second electrode layer 5 may also be 20 atomic percent or less.

In the photoelectric conversion device 10, part corresponding to an aggregate of the buffer layer 4 and the second electrode layer 5, namely, part placed between the light absorbing layer 3 and the power collecting electrodes 8 may mainly contain a Group III-VI compound. Mainly containing the Group III-VI compound means that the Group III-VI compound (if several types of the Group III-VI compounds are adopted, a total thereof) occupies 50 mole percent or more of a compound forming the part corresponding to the aggregate of the buffer layer 4 and the second electrode layer 5. The Group III-VI compound may occupy 80 mole percent or more of a compound forming the part corresponding to the aggregate. The concentration of Zn in the part corresponding to the aggregate of the buffer layer 4 and the second electrode layer 5 may be 50 atomic percent or less. This enhances the resistance to moisture of the photoelectric conversion device 10. The concentration of Zn in the part corresponding to the aggregate of the buffer layer 4 and the second electrode layer 5 may also be 20 atomic percent or less.

The photoelectric conversion device 10 is electrically connected through the connecting conductor 7 to an adjacent photoelectric conversion device 10. This establishes series connection between a plurality of the photoelectric conversion devices 10 to form a photoelectric conversion module 20 as shown in FIG. 1.

The connecting conductor 7 connects the second electrode layer 5 and the third electrode layer 6. In other words, the connecting conductor 7 connects the second electrode layer 5 of one of the photoelectric conversion devices 10 and the first electrode layer 2 of the other photoelectric conversion device 10 adjacent to the former photoelectric conversion device 10. The connecting conductor 7 is provided to divide each of the light absorbing layers 3 of the adjacent photoelectric conversion devices 10. As a result, electricity generated by photoelectric conversion in each of the light absorbing layers 3 can be extracted as a current through the series connection. The connecting conductor 7 may be formed together with the second electrode layer 5 in the same step to be integral with the second electrode layer 5. So, the connecting conductor 7 can be formed in a simple step. This way provides favorable electrical connection between the connecting conductor 7 and the second electrode layer 5 to increase reliability.

The power collecting electrodes 8 function to reduce the electrical resistance of the second electrode layer 5. This makes it possible to extract a current efficiently generated in the light absorbing layer 3. As a result, the power generation efficiency of the photoelectric conversion device 10 is enhanced.

As an example, the power collecting electrodes 8 have a linear shape extending from one edge of the photoelectric conversion device 10 to the connecting conductor 7 as shown in FIG. 1. So, electric charges generated as a result of photoelectric conversion in the light absorbing layer 3 are collected by the power collecting electrodes 8 through the second electrode layer 5. The electric charges thereby collected are transferred through the connecting conductor 7 to the adjacent photoelectric conversion device 10. So, even if the second electrode layer 5 has a small thickness, provision of the power collecting electrodes 8 makes it possible to extract a current efficiently generated in the light absorbing layer 3. Thus, power generation efficiency is enhanced.

It is sufficient that the linear power collecting electrodes 8 have a width of from 50 to 400 μm, for example. This makes it possible to maintain conductivity without involving excessive reduction of a light receiving area of the light absorbing layer 3. The power collecting electrodes 8 may have a plurality of branching sections branching off the power collecting electrodes 8.

As an example, the power collecting electrodes 8 are formed by using metal paste made by diffusing powder of metal such as Ag in a resin binder and the like. The power collecting electrodes 8 are formed by printing the metal paste into a desirable pattern by screen printing and the like, and then curing the metal paste, for example.

The power collecting electrodes 8 may contain solder. This can increase resistance to bending stress and reduce a resistance further. The power collecting electrodes 8 may contain metals of two types or more having different melting points. In this case, the power collecting electrodes 8 may be formed by being heated at a temperature at which a metal of at least one type is melted and a metal of at least one different type is not melted, and cured. As a result, the metal having a lower melting point is melted first to increase the density of the power collecting electrodes 8. Thus, the resistance of the power collecting electrodes 8 is reduced. Meanwhile, the metal having a higher melting point acts to maintain the shape of the power collecting electrodes 8.

The power collecting electrodes 8 may be provided to reach the outer circumferential edge of the light absorbing layer 3 in plan view. In this mode, the power collecting electrodes 8 protect the outer circumferential part of the light absorbing layer 3, so that generation of a crack can be reduced at the outer circumferential part of the light absorbing layer 3. The power collecting electrodes 8 in this condition are capable of extracting a current efficiently generated at the outer circumferential part of the light absorbing layer 3. As a result, power generation efficiency is enhanced.

Also, the outer circumferential part of the light absorbing layer 3 can be protected in this mode, so that a total of the thicknesses of members provided between the first electrode layer 2 and the power collecting electrodes 8 can be reduced. So, the amount of members can be reduced. Further, the light absorbing layer 3, the buffer layer 4, and the second electrode layer 5 corresponding to the aforementioned members can be formed in a shortened period of a step. A total of the thicknesses of the light absorbing layer 3, the buffer layer 4, and the second electrode layer 5 may be from 1.56 to 2.7 μm, for example. More specifically, the thickness of the light absorbing layer 3 is from 1 to 2.5 μm. The thickness of the buffer layer 4 is from 0.01 to 0.2 μm. Further, the thickness of the second electrode layer 5 is from 0.05 to 0.5 μm.

Edge surfaces of the power collecting electrodes 8, and edge surfaces of the second electrode layer 5 and the light absorbing layer 3 may be in the same plane at the outer circumferential edge of the light absorbing layer 3. This makes it possible to favorably extract a current generated as a result of photoelectric conversion at the outer circumferential edge of the light absorbing layer 3. The power collecting electrodes 8 are not always required to reach the outer circumferential edge of the light absorbing layer 3 when the power collecting electrodes 8 are seen in plan view. If a distance between the outer circumferential edge of the light absorbing layer 3 and the edge portions of the power collecting electrodes 8 does not exceed 1000 µm, for example, generation of a crack starting from the outer circumferential edge of the light absorbing layer 3 and development of such a crack can be reduced.

The invention is not limited to the embodiment described above, but various modifications can certainly be devised without departing from the scope of the invention. As an example, while the light absorbing layer 3 is comprised of three semiconductor layers in the embodiment described above, it may also be comprised of two or more semiconductor layers.

REFERENCE NUMERALS

1 Substrate
2 First electrode layer
3 Light absorbing layer
3*a* First layer
3*b* Second layer
3*c* Third layer
3D Boundary
4 Buffer layer
5 Second electrode layer
6 Third electrode layer
7 Connecting conductor
8 Power collecting electrode
10 Photoelectric conversion device
20 Photoelectric conversion module

The invention claimed is:

1. A photoelectric conversion device, comprising
an electrode layer, and
a light absorbing layer located on the electrode layer,
the light absorbing layer comprises a plurality of stacked semiconductor layers containing a chalcopyrite-based Group I-III-VI compound semiconductor,
the plurality of semiconductor layers contain oxygen, and a molar concentration of the oxygen in surfaces and their vicinities of the plurality of semiconductor layers where the plurality of semiconductor layers are stacked on each other is higher than average molar concentrations of the oxygen in the plurality of semiconductor layers.

2. The photoelectric conversion device according to claim 1, wherein the plurality of semiconductor layers contain selenium, and a molar concentration of the selenium in surfaces and their vicinities of the plurality of semiconductor layers where the plurality of semiconductor layers are stacked on each other is lower than average molar concentrations of the selenium in the plurality of semiconductor layers.

3. The photoelectric conversion device according to claim 1, wherein in the light absorbing layer, an average molar concentration of the oxygen is higher in the semiconductor layer which exists in a region close to the electrode layer with respect to a central part of a stacking direction than in the semiconductor layer which exists in a region on a side opposite the electrode layer with respect to the central part.

4. The photoelectric conversion device according to claim 1, wherein the plurality of semiconductor layers contain gallium, and a molar concentration of the gallium in surfaces and their vicinities of the plurality of semiconductor layers where the plurality of semiconductor layers are stacked on each other is higher than average molar concentrations of the gallium in the plurality of semiconductor layers.

5. The photoelectric conversion device according to claim 4, wherein in the light absorbing layer, an average molar concentration of the gallium is higher in the semiconductor layer which exists in a region close to the electrode layer than in the semiconductor layer at a central part of a stacking direction.

6. The photoelectric conversion device according to claim 4, wherein in the light absorbing layer, an average molar concentration of the gallium is higher in the semiconductor layer which exists in a region on a side opposite the electrode layer than in the semiconductor layer at a central part of a stacking direction.

* * * * *